(12) United States Patent
Nishio et al.

(10) Patent No.: US 8,344,515 B2
(45) Date of Patent: Jan. 1, 2013

(54) SEMICONDUCTOR DEVICE

(75) Inventors: Taichi Nishio, Osaka (JP); Hiroshige Hirano, Nara (JP); Yukitoshi Ota, Osaka (JP)

(73) Assignee: Panasonic Corporation, Osaka (JP)

( * ) Notice: Subject to any disclaimer, the term of this patent is extended or adjusted under 35 U.S.C. 154(b) by 331 days.

(21) Appl. No.: 12/782,360

(22) Filed: May 18, 2010

(65) Prior Publication Data

US 2010/0225005 A1  Sep. 9, 2010

Related U.S. Application Data

(63) Continuation-in-part of application No. PCT/JP2009/003432, filed on Jul. 22, 2009.

(30) Foreign Application Priority Data

Aug. 28, 2008  (JP) ................. 2008-220256

(51) Int. Cl.
    *H01L 23/48*  (2006.01)

(52) U.S. Cl. ........ 257/774; 257/659; 257/686; 257/700; 257/723; 257/726

(58) Field of Classification Search .................... None
    See application file for complete search history.

(56) References Cited

U.S. PATENT DOCUMENTS

| | | |
|---|---|---|
| 2006/0118965 A1 | 6/2006 | Matsui |
| 2006/0197181 A1 | 9/2006 | Noguchi |
| 2007/0023887 A1 | 2/2007 | Matsui |
| 2007/0126122 A1* | 6/2007 | Bauer et al. ................... 257/774 |
| 2007/0291180 A1* | 12/2007 | Takatori ....................... 348/726 |

FOREIGN PATENT DOCUMENTS

| | | |
|---|---|---|
| JP | 10-163411 | 6/1998 |
| JP | 2004-335948 | 11/2004 |

* cited by examiner

*Primary Examiner* — Kyoung Lee
(74) *Attorney, Agent, or Firm* — McDermott Will & Emery LLP

(57) ABSTRACT

A semiconductor device includes a plurality of through vias extending through a substrate. The plurality of through vias are arranged dividedly in three or more via groups. Each of the via groups includes three or more of the through vias that are arranged in two dimensions.

20 Claims, 7 Drawing Sheets

FIG. 2A
FIG. 2B
FIG. 2C
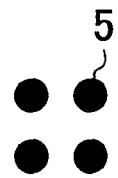
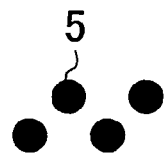
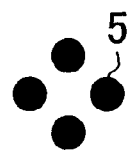
FIG. 3A
FIG. 3B
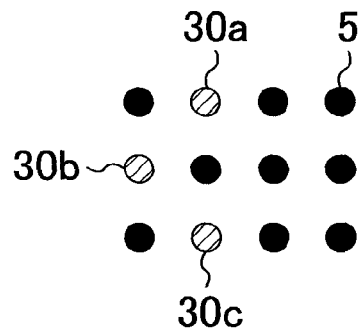
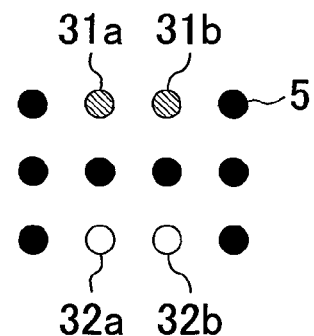
FIG. 4A
FIG. 4B
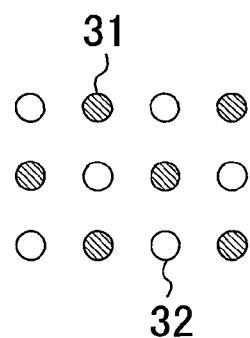
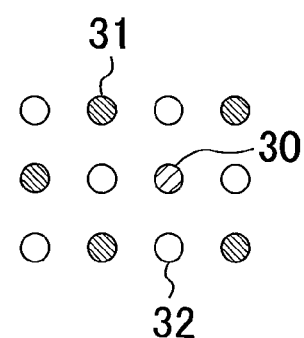

under PCT International Application
PCT/JP2009/003432 filed on Jul. 22, 2009, which claims
priority to Japanese Patent Application No. 2008-220256
filed on Aug. 28, 2008. The disclosures of these applications
including the specifications, the drawings, and the claims are
hereby incorporated by reference in its entirety.

SEMICONDUCTOR DEVICE

CROSS-REFERENCE TO RELATED APPLICATION

This is a continuation of PCT International Application PCT/JP2009/003432 filed on Jul. 22, 2009, which claims priority to Japanese Patent Application No. 2008-220256 filed on Aug. 28, 2008. The disclosures of these applications including the specifications, the drawings, and the claims are hereby incorporated by reference in its entirety.

BACKGROUND

The present disclosure relates to a semiconductor device having through vias.

In recent years, a stacked semiconductor device in which a plurality of semiconductor chips are stacked has been developed to provide the semiconductor device with higher functionality and higher integration. However, in most stacked semiconductor devices, semiconductor chips that have been stacked using wire bonding are electrically connected to each other via an interconnect substrate such as an interposer. Accordingly, the size of a stacked semiconductor device corresponds to a size obtained by adding the size of a space for wire routing to the sizes of the semiconductor chips, which limits the miniaturization of the stacked semiconductor device. In such a stacked semiconductor device, the use of wire bonding increases a wiring length, which increases wiring resistance and also limits a high-speed operation.

As a solution to the foregoing problem, a stacked semiconductor device (see Japanese Laid-Open Patent Publication No. 10-163411) as shown in FIG. 10 has been proposed. In the device, a plurality of stacked semiconductor chips are electrically connected using through vias formed by forming through holes in the semiconductor chips, and filling the through holes with a conductive resin or metal. Specifically, as shown in FIG. 10, the stacked semiconductor device in which semiconductor chips 1001D, 1001C, 1001B, and 1001A are successively stacked in an ascending order is provided with a plurality of through vias 1003. The individual semiconductor chips are bonded to each other using an insulating resin 1004. Around the respective through vias 1003 at the back surface of each of the semiconductor chips, via extraction pads 1002 are provided individually. Note that, to achieve stable electrical connections at the via extraction pads 1002, voids 1005 are formed around the respective through vias 1003 in the insulating resin 1004, and are each filled with the same material as that of the through vias 1003.

In the structure shown in FIG. 10, the stacked semiconductor chips can be directly connected to each other so that the size of the entire stacked semiconductor device is determined only by the sizes of the semiconductor chips. Also, in the structure shown in FIG. 10, the semiconductor chips can be electrically connected to each other with a wiring length shorter than in the case where the semiconductor chips are electrically connected to each other by wire bonding. This allows a reduction in wiring resistance, and enables a high-speed operation. Furthermore, since it is possible to reduce the height of the stacked semiconductor device by thinning each of the semiconductor chips to be stacked, the size of the entire stacked semiconductor device can be reduced as compared to that of a conventional structure.

As an example of a typical layout of the through vias described above, there is a layout of the through vias in a stacked semiconductor device (see Japanese Laid-Open Patent Publication No. 2004-335948) as shown in FIG. 11. In a device 1100, through vias 1105 are arranged with an equal pitch over the entire device.

SUMMARY

However, each of the semiconductor devices having the through vias according to the conventional embodiments has the problem of unstable electrical characteristics of active elements.

In view of the foregoing, an object of the present disclosure is to stabilize the electrical characteristics of active elements in a semiconductor device having through vias.

To attain the object, the present inventors have examined the cause of unstable electrical characteristic of the active elements in each of the semiconductor devices having the through vias according to the conventional embodiments, and made the following findings.

A through via is formed by filling a through hole formed using a photolithographic or etching technique with a via material. However, as a result of undergoing such a series of processes, a distortion occurs in a substrate so that a stress is applied to an element such as a transistor formed around the through via.

In addition, the operation of the semiconductor device generates heat but, because the thermal expansion coefficient of the substrate is different from that of the through via, the amount of expansion of the substrate is different from that of the through via in the heated semiconductor device. As a result, the stress resulting from the different amounts of expansion is undesirably applied to the region of the substrate located around the through via.

An active element such as a transistor or a diode is made of a crystalline material such as silicon. However, the mobility of charges in a crystalline material is generally varied by the application of a stress so that, when a stress is applied, the operating current of the active element changes disadvantageously.

Thus, a problem arises that, in an active element disposed in close proximity to a through via, the operating current thereof changes.

To avoid the problem, the present inventors have considered providing a region where an active element is not placed around a through via. In the present application, a region around the through via where an active region is not placed is hereinafter referred to as a "buffer region", and a region where an active element having an impurity layer, such as a transistor or diode, is placed is hereinafter referred to as an "active element region". Here, a size required of the buffer region differs depending on the diameter of the through via but, for a through via having a diameter of, e.g., 1 μm, the size required of the buffer region is in a radial range of about 5 μm around the through via.

However, in the case where the "buffer regions" are set in a conventional layout of through vias as shown in, e.g., FIG. 11, a problem as shown in FIG. 12 occurs. That is, when it is assumed that, in the case where the through vias 1105 are arranged in an area array state as shown in FIG. 11, buffer regions 1106 where active regions are not placed are provided around the respective through vias 1105 for the avoidance of the influence or thermal expansion of a stress resulting from each of the through vias 1105, the buffer regions 1106 occupy a large area in the semiconductor device 1100. Accordingly, it is impossible to ensure a sufficiently large area to an active element region 1103 set in the region other than the buffer regions 1106. As a result, a problem arises that active elements cannot be arranged with a high area efficiency over the surface of the semiconductor device where the active elements are to be formed, and the miniaturization of the semiconductor device cannot be achieved.

Therefore, in order to solve the new problem, i.e., in order to reduce the area occupied by the buffer regions without reducing the number of the through vias in the semiconductor device, and allow effective use of the active element formation surface of the semiconductor device as well as easy miniaturization of the semiconductor device, the present inventors have obtained the following idea.

That is, a semiconductor device according to the present disclosure is a semiconductor device, including: a plurality of through vias extending through a substrate, wherein the plurality of through vias are arranged dividedly in three or more via groups, and each of the via groups includes three or more of the through vias that are arranged in two dimensions.

In the semiconductor device according to the present disclosure, the plurality of through vias arranged in two dimensions are collectively disposed to form the via groups. Therefore, in the case where "buffer regions" are provided around the respective through vias, the through vias adjacent to each other in each of the via groups can share the common buffer region. Accordingly, it is possible to reduce the area occupied by the buffer regions, and ensure a large area to an active element region in the semiconductor device. This allows effective use of the active element formation surface of the semiconductor device, and thereby allows easy miniaturization of the semiconductor device. In addition, since it is possible to provide the buffer regions around the through vias while achieving the miniaturization of the semiconductor device, it is possible to prevent the electrical characteristics of active elements from becoming unstable due to the through vias.

When the semiconductor device according to the present disclosure is mounted on a base substrate such as a resin interposer, or when the semiconductor device according to the present disclosure and another semiconductor device are stacked, a stress resulting from the mounting or stacking (assembly) is applied to the semiconductor device according to the present disclosure. However, since the three or more via groups each including the plurality of through vias disposed in two dimensions are disposed in the semiconductor device according to the present disclosure, it is possible to perform the mounting or stacking while ensuring a balanced state without biasing the stress described above, and thereby improve reliability.

In the semiconductor device according to the present disclosure, a wiring layer forming an integrated circuit is formed on at least one of the first surface and the second surface opposite to the first surface of the substrate, and at least one of the plurality of through vias and the wiring layer may be electrically connected to each other.

It will be appreciated that, in the semiconductor device according to the present disclosure, an active element is preferably not formed in any of respective regions of the substrate where the individual via groups are disposed.

In the semiconductor device according to the present disclosure, the smallest distance between the individual through vias in each of the via groups is preferably smaller than the smallest one of distances between an active element formed on the substrate and the plurality of through vias. That is, since each of the through vias does not undergo changes in the characteristics thereof under the influence of the foregoing stress or heat, the through vias can be brought closer to each other within a range in which a short-circuit does not occur. As a result, by reducing the smallest distance between the individual through vias in each of the via group (i.e., the distance between the respective centers of the through vias in closest proximity in the via group) to a value smaller than the smallest one of the distances between the individual through vias (precisely the respective centers of the individual through vias) and the active element (i.e., the active element region surrounded by an isolation), it is possible to efficiently reduce the area occupied by the buffer regions in the semiconductor device. This allows further miniaturization of the semiconductor device.

In the semiconductor device according to the present disclosure, the smallest distance between the individual via groups may be larger than the largest distance between the individual through vias in the one of the via groups that has the smallest layout area. In other words, in the semiconductor device according to the present disclosure, the distance between the via groups may be set to a value equal to or larger than the layout size of the smallest via group.

In the semiconductor device according to the present disclosure, at least one of the via groups may include two or more of the through vias that have different potentials, or include two or more of the through vias that have the same potentials. In the case where at least one of the via groups includes the two or more through vias having the same potentials, even if a problem such as a bonding failure or opening failure of the through via occurs between the semiconductor device according to the present disclosure and a base substrate or another semiconductor device and then one of the through vias having the same potentials cannot provide an electrical connection any more due to the problem, the other through via having the same potential can provide an electrical connection. This allows an improvement in the reliability of the semiconductor device. In particular, in the case where the same signal is inputted to each of the two or more through vias having the same potentials, it is possible to achieve an improvement in the yield of the semiconductor device. Also, in the case where the two or more through vias having the same potentials form the same power supply line, it is possible to improve the yield of the semiconductor device and reduce the resistance of a power supply line. Note that one of the two or more through vias having the same potentials may be disposed at a peripheral portion of the via group. That is, in the case of causing a shape failure resulting from a process or the like at the peripheral portion of the via group through the adjustment of process conditions, by disposing one of the through vias having the same potentials at the peripheral portion, i.e., by not disposing the plurality of through vias having the same potentials at the peripheral portion, a reduction in the reliability of the semiconductor device can be inhibited even when a problem such as a shape failure occurs.

In the semiconductor device according to the present disclosure, at least one of the via groups may include a first through via having a first potential, and a second through via having a second potential complementary to the first potential, and adjacent to the first through via. For example, in the case where the first through via forms a power supply line, and the second through via forms a ground line, the capacitance between the power supply line and the ground line can be increased. Accordingly, it is possible to reduce a variation in the supply voltage to the semiconductor device in response to a variation in power supply voltage. Also, in the case where the via group further includes a third through via to which a signal is inputted, and the first through vias and the second through vias are alternately arranged so as to surround the third through via, for example, the power supply line and the ground line function as a shield for signal lines which prevent mutual interference therebetween. Therefore, it is possible to implement a semiconductor device with reduced crosstalk.

In the semiconductor device according to the present disclosure, the via groups may be equidistantly arranged. In the arrangement, when the semiconductor device according to the present disclosure is bonded to a base substrate or when the semiconductor device according to the present disclosure and another semiconductor device are stacked, and then the gap between the semiconductor device according to the present disclosure and the base substrate or the other semiconductor device is filled with a filler such as, e.g., an underfill, the filling of the gap with the underfill can be easily performed due to the equidistant arrangement of the via groups. This allows an improvement in the ratio of filling with the underfill, and thereby allows an improvement in bonding reliability.

In the semiconductor device according to the present disclosure, at least one of the via groups may include a dummy through via not used for an electrical connection. This allows the prevention of the occurrence of a problem such as a shape failure which occurs in the through via due to a process such as the step of transferring a via hole pattern by photolithography or the step of forming a via hole by etching. Therefore, it is possible to improve the reliability of the semiconductor device having the through vias. In this case, the dummy through via may be disposed at a peripheral portion of the via group. That is, in the case of causing a shape failure resulting from a process at the peripheral portion of the via group through the adjustment of process conditions, the occurrence of a problem such as a shape failure in the true through via can be prevented by disposing the dummy through via at the peripheral portion, i.e., by not disposing the true through via at the peripheral portion. Therefore, it is possible to improve the reliability of the true through via.

In the semiconductor device according to the present disclosure, at least one of the via groups may include an auxiliary through via which assists an electrical connection to another through via. For example, in the case where the true through via and the auxiliary through via thereof form the same power supply line, the resistance of the power supply line can be reduced, and therefore a reduction in the power supply voltage supplied to the semiconductor device can be inhibited. In this case, the auxiliary through via may be disposed at a peripheral portion of the via group. That is, in the case of causing a shape failure resulting from a process at the peripheral portion of the via group through the adjustment of process conditions, even when a problem such as a shape failure occurs, a reduction in the reliability of the true through via can be prevented by disposing the auxiliary through via at the peripheral portion, i.e., by not disposing the true through via at the peripheral portion.

A stacked semiconductor device according to the present disclosure is a stacked semiconductor device in which a plurality of semiconductor devices are stacked, wherein at least one of the plurality of semiconductor devices is the semiconductor device according to the present disclosure described above.

The stacked semiconductor device according to the present disclosure allows implementation of a stacked semiconductor device which is smaller in size, higher in density, and shorter in wiring length. Therefore, it is possible to implement the stacked semiconductor device having higher performance and higher functionality.

Note that, in the stacked semiconductor device according to the present disclosure, the through via forming the via group in the semiconductor device according to the present disclosure may also be electrically connected to, e.g., the through via of another semiconductor device or to an electrode pad formed on another semiconductor device.

A stacked semiconductor device according to the present disclosure is a stacked semiconductor device in which a plurality of semiconductor devices are stacked, wherein each of two or more of the plurality of semiconductor devices is the semiconductor device according to the present disclosure described above, and the individual via groups in each of the semiconductor devices are arranged so as not to overlap each other. In the arrangement, when a stress is applied to the stacked semiconductor device, the stress can be equally applied to the entire device. Therefore, it is possible to avoid damage to the stacked semiconductor device.

Thus, according to the present disclosure, in the semiconductor device having the through vias, the plurality of through vias arranged in two dimensions are collectively disposed to form the via groups. Therefore, it is possible to reduce the area occupied by the buffer regions where active elements cannot be placed in the semiconductor device, and thereby achieve the miniaturization of the semiconductor device. In addition, since it is possible to provide the buffer regions around the through vias while achieving the miniaturization of the semiconductor device, it is possible to prevent the electrical characteristics of the active elements from becoming unstable due to the through vias.

Also, according to the present disclosure, in the semiconductor device having the through vias, the three or more via groups each including the plurality of through vias arranged in two dimensions are disposed. As a result, it is possible to prevent the stress applied to the semiconductor device during assembly including the mounting, stacking, or the like of the semiconductor device from being biased, i.e., it is possible to perform assembly while ensuring a state in which the stress applied to the semiconductor device is balanced. Therefore, it is possible to improve reliability.

That is, the present disclosure relates to the semiconductor device having the through vias, and forms the via groups by collectively disposing the plurality of through vias. As a result, even when the buffer regions are provided around the through vias, it is possible to stabilize the electric characteristics of the active elements while achieving the miniaturization of the semiconductor device and, therefore, the present disclosure is extremely useful.

BRIEF DESCRIPTION OF THE DRAWINGS

FIGS. 1A-1E show a semiconductor device according to a first example embodiment of the present disclosure, of which FIG. 1A is a cross-sectional view of the semiconductor device, and each of FIGS. 1B-1E is a plan view of the semiconductor device.

FIGS. 2A-2C are views showing examples of an arrangement of through vias in a via group provided in the semiconductor device according to the first example embodiment.

FIGS. 3A and 3B are views each showing a plan configuration of a via group in a semiconductor device according to a second example embodiment of the present disclosure.

FIG. 4A is a view showing a plan configuration of a via group in a semiconductor device according to a third example embodiment of the present disclosure, and FIG. 4B is a view showing a plan configuration of a via group in a semiconductor device according to a variation of the third example embodiment.

DETAILED DESCRIPTION

Figure 1A:
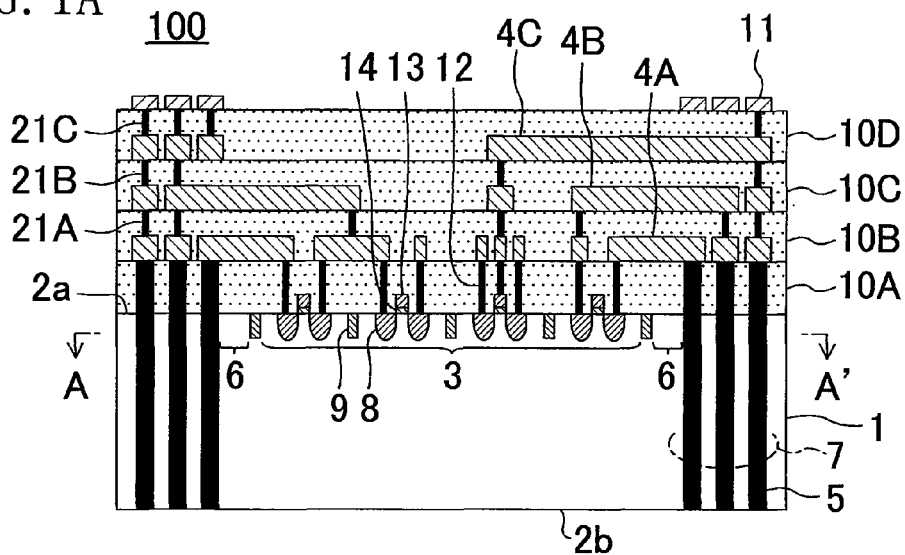

Referring to the drawings, the present disclosure will be described in detail based on the individual example embodiments thereof.

First Example Embodiment

Figure 1B:
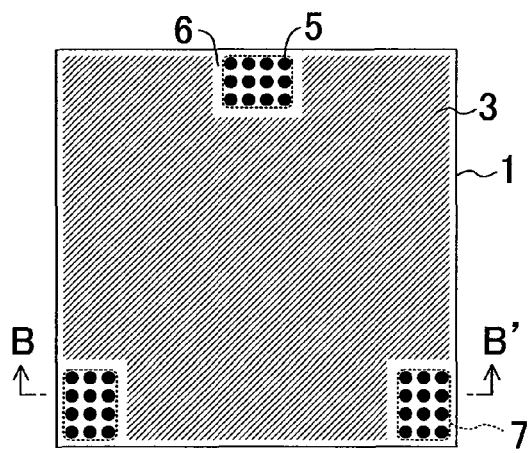

FIGS. 1A and 1B show a semiconductor device 100 according to the first example embodiment, of which FIG. 1A is a cross-sectional view of the semiconductor device 100, and FIG. 1B is a plan view of the semiconductor device 100. Note that a cross-sectional view along the plane B-B' in FIG. 1B corresponds to FIG. 1A, and a cross-sectional view along the plane A-A' in FIG. 1A corresponds to FIG. 1B.

As shown in FIG. 1A, in the surface portion of a first principal surface 2a of a semiconductor substrate 1, formed are impurity layers 8 which form active elements such as a transistor, a diode, and the like and an isolation 9 which isolates the individual active elements and, on the first principal surface 2a of the semiconductor substrate 1, formed are gate electrodes 13 with gate insulating films 14 interposed therebetween. Note that, in the semiconductor device 100, the individual active elements are collectively disposed in an active element region 3 which is surrounded by the isolation 9.

Over the first principal surface 2a of the semiconductor substrate 1, an insulating layer 10A is formed so as to cover the gate electrodes 13. On the insulating layer 10A, formed is a wire 4A which performs signal transmission and power supply in the semiconductor device 100. In the insulating layer 10A, formed are plugs 12 which connect the wire 4A and the impurity layers 8.

Over the insulating layer 10A, an insulating layer 10B is formed so as to cover the wire 4A. Over the insulating layer 10B, formed is a wire 4B which performs signal transmission and power supply in the semiconductor device 100. In the insulating layer 10B, formed are vias 21A which connect the wire 4B and the wire 4A.

Over the insulating layer 10B, an insulating layer 10C is formed so as to cover the wire 4B. On the insulating layer 10C, formed is a wire 4C which performs signal transmission and power supply in the semiconductor device 100. In the insulating layer 10C, formed are vias 21B which connect the wire 4C and the wire 4B.

Over the insulating layer 10C, an insulating layer 10D is formed so as to cover the wire 4C. On the insulating layer 10D, formed are electrode pads 11 each for extracting a signal from the wire 4C to the outside of the device. In the insulating layer 10D, formed are vias 21C which connect the electrode pads 11 and the wire 4C.

In the semiconductor device 100 according to the present example embodiment, a plurality of through vias 5 are formed to extend from the first principal surface 2a to a second principal surface 2b through the semiconductor substrate 1 and the insulating layer 10A to be electrically connected to the wire 4A. Here, the present example embodiment is characterized in that the plurality of through vias 5 are arranged dividedly in three or more via groups 7, and each of the via groups 7 includes three or more of the through vias 5 that are arranged in two dimensions. In addition, between the individual via groups 7 and the active element region 3, respective buffer regions 6 where the active elements are not placed are disposed to prevent the active elements from receiving the influence of a stress resulting from the through vias 5 or the like.

Specifically, as shown in the plan view of FIG. 1B, the total of twelve through vias 5 are collectively arranged in four rows and three columns to form one of the via groups 7, and three of the via groups 7 are disposed in the semiconductor device 100.

Examples of the material of the through vias 5 that can be used include copper, tungsten, aluminum, and polysilicon.

The diameter of each of the through vias 5 is in a range of about 0.5 to 20 µm (or preferably 0.5 to 5 µm), and the length (height) of each of the through vias 5 is in a range of about 5 to 50 µm.

Preferably, an insulating film for providing an electrical insulation between each of the through vias 5 and the semiconductor substrate 1 is formed so as to cover the sidewalls of the through via 5 with a protective film for preventing the diffusion of the material of the through via interposed between the insulating film and the sidewalls of the through via 5, although the depiction thereof is omitted. Examples of the material of the insulating film that can be used include $SiO_2$ and SiN. As the material of the protective film, a material having a barrier property which can prevent the diffusion of the material of the through vias is preferred, and examples thereof that can be used include Ta, TaN, and TiN.

As described above in the summary of the present disclosure, the active elements cannot be disposed in close proximity to the through vias. However, since the material forming the through vias does not undergo changes in the characteristics thereof under the influence of a stress or the like, the individual through vias can be disposed in close proximity to an extent that a short circuit does not occur therebetween. Therefore, by densely arranging the through vias, it is possible to consolidate the buffer regions.

In the semiconductor device 100 according to the present example embodiment, the plurality of through vias 5 arranged in two dimensions are collectively disposed to form the via groups 7. As a result, it is possible to consolidate the buffer regions 6 around the through vias where the active elements are not placed. Accordingly, it is possible to reduce the area occupied by the buffer regions 6 in the semiconductor device as compared to that in a conventional structure, i.e., it is possible to ensure a large area to the active element region 3, and effectively use the active element formation surface (which is the first principal surface 2a in the present example embodiment) of the semiconductor device 100. This allows easy miniaturization of the semiconductor device 100. In addition, since it is possible to provide the buffer regions 6 around the through vias while achieving the miniaturization of the semiconductor device 100, it is possible to prevent the electrical characteristics of the active elements from becoming unstable due to the through vias 5.

The area of the active element formation surface of the semiconductor device 100 according to the present example embodiment is about 24% smaller than that in a conventional semiconductor device in which, for example, thirty-six through vias each having a square cross-sectional shape having four sides of 1 μm when viewed from above the upper surface thereof are arranged in an area array configuration with a pitch (distance between the respective centers of the through vias) of 20 μm and a buffer region is set in a range of 4 μm from the end portion of each of the through vias in a peripheral region thereof. Note that, in the semiconductor device 100 according to the present example embodiment, it is assumed that the three via groups 7 each including the total of twelve through vias 5 arranged in four rows and three columns (the total number of the through vias 5 is 36) are disposed, the arrangement pitch of the through vias 5 in the via groups 7 is 2 μm, and the buffer region 6 is set in a range of 4 μm from the end portion of each of the via groups 7 in a peripheral region thereof.

Note that, in the semiconductor device 100, the distance (layout space) between the through vias 5 adjacent to each other in each of the via groups 7 is in a range of about 0.1 to 10 μm (preferably 0.5 to 5 μm). Preferably, the buffer region 6 where the active elements are not placed is provided in a range of 0.5 to 10 μm from the end portion of each of the via groups 7 in a peripheral region thereof.

According to the present example embodiment, when the semiconductor device 100 is mounted on a base substrate such as a resin interposer or when the semiconductor device 100 and another semiconductor device are stacked, a stress resulting from the mounting or stacking (assembly) is applied to the semiconductor device 100. However, in the present example embodiment, the three via groups 7 each including the plurality of through vias 5 arranged in two dimensions are disposed in the semiconductor device 100. Therefore, it is possible to perform the mounting or stacking while ensuring a balanced state without biasing the stress, and thereby improve reliability.

Figure 1C:
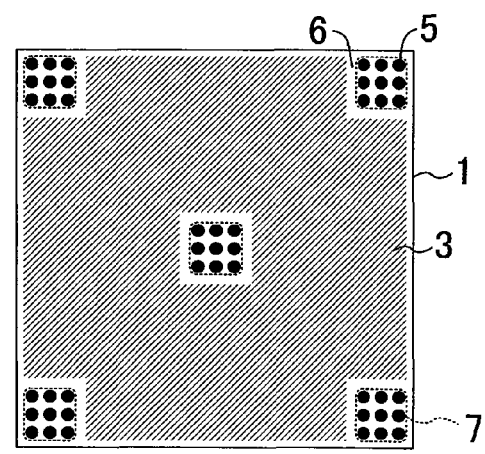
Figure 1D:
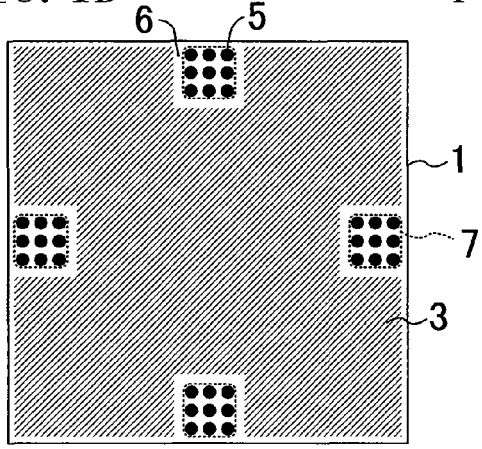
Figure 1E:
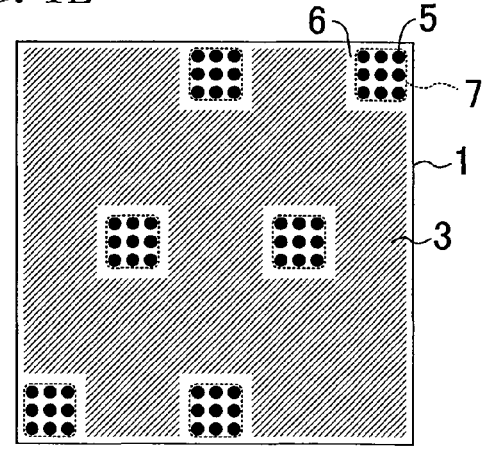

In the present example embodiment, the number of the via groups 7 disposed in the semiconductor device 100 is not particularly limited as long as it is 3 or more. Also, the number of the through vias 5 forming each of the via groups 7 is not particularly limited as long as it is 3 or more. That is, instead of the plan configuration shown in FIG. 1B, e.g., the plan configurations shown in FIGS. 1C-1E may also be used. Here, the via groups 7 may be equidistantly arranged in a vertical (top-bottom) direction, in a lateral (left-right) direction, or in a diagonal direction.

Further, the arrangement of the through vias 5 in each of the via groups 7 is not also particularly limited as long as it is a two-dimensional arrangement. FIGS. 2A-2C show an example of the arrangement of the through vias 5 in each of the via groups 7. That is, in each of the via groups 7 in the semiconductor device 100 shown in FIG. 1B, the three through vias 5 and the four through vias 5 are arranged in the vertical and lateral directions, respectively. However, the concept of the present disclosure is not limited to the numbers and the arrangement. For example, it is also possible to form the via groups 7 each including a single or plurality of arrangements of the through vias 5 as shown in FIGS. 2A-2C as basic units.

In the present example embodiment, each of the numbers of the through vias 5 forming the individual via groups 7 disposed in the semiconductor device 100 has been set to the same value. However, the concept of the present disclosure is not limited thereto. The numbers of the through vias included in the individual via groups may also differ from one via group to another.

In the present example embodiment, each of the diameters of the through vias 5 has been set to the same value. However, the concept of the present disclosure is not limited thereto. The diameters of the through vias may also differ from one through via to another.

In the present example embodiment, the through vias 5 are connected to the wire (first-layer wire) 4A, as shown in FIG. 1A. However, the concept of the present disclosure is not limited thereto. The through vias 5 may also be connected to another wire (4B or 4C) in the semiconductor device 100 or connected directly to the electrode pads 11. The through vias 5 may also be protruded upwardly from the semiconductor device 100. Further, the through vias 5 need not necessarily be connected to the wire (4A, 4B, or 4C) in the semiconductor device 100. In this case, the through vias 5 are connected to the electrode pads of the base substrate on which the semiconductor device 100 is mounted or to the electrode pads of another semiconductor device stacked over or under the semiconductor device 100. Note that the electrode pads are parts of a wiring layer.

In the present example embodiment, the wiring layer is provided on the first principal surface 2a of the semiconductor substrate 1. However, instead of or in addition to this, a wiring layer may also be provided on the second principal surface 2b of the semiconductor substrate 1. In this case, the wiring layer on the second principal surface 2b and the through vias 5 may also be electrically connected to each other.

In the present example embodiment, as shown in FIGS. 1B and 2A-2C, the cross-sectional shape of each of the through vias 5 when viewed from above the upper surface thereof is a circle. However, the concept of the present disclosure is not limited thereto. If another shape is desirable for process or design reasons, the cross-sectional shape of each of the through vias 5 when viewed from above the upper surface thereof may also be a polygon, an ellipsoid, or the like.

It will be appreciated that, in the present example embodiment, the active elements are preferably not formed in the respective regions of the semiconductor substrate 1 where the individual via groups 7 are placed.

Also, in the present example embodiment, the smallest distance between the individual through vias 5 in each of the via groups 7 is preferably smaller than the smallest one of the distances between each of the active elements formed on the semiconductor substrate 1 and the through vias 5. That is, since each of the through vias 5 does not undergo changes in the characteristics thereof under the influence of the foregoing stress and heat, it is possible to bring the through vias 5 closer to each other within a range in which a short circuit does not occur therebetween. Therefore, by reducing the shortest distance between the individual through vias 5 in each of the via groups 7 (i.e., the distance between the respective centers of the through vias 5 in closest proximity in the via group 7) to a value smaller than the shortest one of the distances between the individual through vias 5 (precisely the respective centers of the individual through vias 5) and each of the active elements (i.e., the active element region 3 surrounded by the isolation 9), the area occupied by the buffer regions 6 in the semiconductor device 100 can be more efficiently reduced, and hence further miniaturization of the semiconductor device 100 can be achieved.

In the present example embodiment, the smallest distance between the individual via groups 7 described above may also be larger than the largest distance between the individual through vias 5 in the one of the via groups 7 that has the smallest layout area. In other words, in the semiconductor device 100, the distances between the via groups 7 may also be set equal to or larger than the layout size of the smallest via group 7.

In the present example embodiment, at least one of the via groups 7 may include two or more of the through vias 5 that have different potentials or two or more of the through vias 5 that have the same potentials.

Second Example Embodiment

FIGS. 3A and 3B are views each showing a plan configuration of a via group in a semiconductor device according to the second example embodiment. Note that the second example embodiment is obtained by modifying the first example embodiment shown in FIGS. 1A and 1B, and is basically the same as the first example embodiment except for the items described below.

In the single via group shown in FIG. 3A in which the plurality of through vias 5 are placed, three through vias (hereinafter referred to as signal through vias) 30a, 30b, and 30c to each of which the same signal is inputted are further placed. The configuration allows an improvement in the reliability of the through vias, as will be described later.

During the formation of a through via, there is a case where a problem resulting from process conditions occurs in the through via, such as, e.g., the case where the filling of a through hole with a metal is defective and then a conduction failure occurs in the through via. There is also a case where a bonding failure occurs when the through vias provided in the semiconductor device is connected to a base substrate or to another semiconductor device.

By contrast, in the case of the via group shown in FIG. 3A, there are the plurality of signal through vias to each of which the same signal is inputted in the single via group. Therefore, even if a connection failure occurs in the through via 30a, it is possible to ensure an electrical connection with the other signal through vias 30b and 30c. As a result, it is possible to reliably perform signal transmission and reception without reducing the reliability. That is, there is no situation where the semiconductor becomes defective, and hence it is possible to improve the yield.

In the single via group shown in FIG. 3B in which the plurality of through vias 5 are placed, two through vias 31a and 31b (hereinafter referred to as the power-supply through vias 31a and 31b) to each of which the same power supply voltage is inputted (i.e., forming the same power supply line) and two through vias 32a and 32b (hereinafter referred to as the ground through vias 32a and 32b) each having a ground potential (i.e., forming the same ground line) are further placed. In the configuration, even when a connection failure occurs in the power-supply through via 31a or in the ground through via 32a, there is no situation where the semiconductor device becomes defective. Therefore, it is possible to improve the yield. In addition, since the plurality of through vias forming the same power supply line are placed, it is possible to reduce the resistance of the power supply line, and reduce a reduction in the power supply voltage supplied to the semiconductor device.

It will be appreciated that, in the present disclosure, the respective numbers of the same-signal through vias, the power-supply through vias, and the ground through vias which are placed in the single via group are not limited to the examples of the present example embodiment shown in FIGS. 3A and 3B as long as each of the numbers is 2 or more.

In the case of causing a shape failure resulting from a process at a peripheral portion of the via group through the adjustment of process conditions, by disposing one of the same-signal through vias, one of the power-supply through vias, or one of the ground through vias at the peripheral portion, i.e., by not disposing the plurality of same-signal through vias, the plurality of power-supply through vias, or the plurality of ground through vias at the peripheral portion, a reduction in the reliability of the semiconductor device can be inhibited even when a problem such as a shape failure occurs.

Third Example Embodiment

FIG. 4A is a view showing a plan configuration of a via group in a semiconductor device according to the third example embodiment. Note that the third example embodiment is obtained by modifying the first example embodiment shown in FIGS. 1A and 1B, and is basically the same as the first example embodiment except for the items described below.

In a conventional semiconductor device, when a power supply voltage supplied to the semiconductor device changes in response to a load variation, active elements such as a transistor and a diode forming the semiconductor device may vary. Therefore, to suppress variations in the operations of the active elements, it has been generally practiced to suppress a voltage variation of active elements by placing a capacitor on a base substrate or the like in the vicinity of the semiconductor device.

In the via group shown in FIG. 4A according to the present example embodiment, through vias 31 (hereinafter referred to as the power-supply through vias 31) each forming a power supply line and through vias 32 (hereinafter referred to as the ground through vias 32) each forming a ground line complementary to the power supply line are alternately arranged in mutually adjacent relation. The configuration allows an increase in the capacitance between the power-supply through vias 31 and the ground through vias 32, and allows the use of the capacitance as a capacitor which inhibits a voltage variation. In other words, it is possible to reduce a variation in the voltage supplied to the semiconductor device in response to a variation in power supply voltage. As a result, there is no need to place the capacitor in the vicinity of the semiconductor device having the through vias, and the miniaturization of the semiconductor device can be achieved.

Note that, in the present example embodiment, by reducing the distance between the through vias in the via group to a degree that a short circuit does not occur therebetween, the capacitance between the power-supply through vias 31 and the ground through vias 32 can be increased to enhance the effect of inhibiting a voltage variation. Accordingly, the distance between the through vias (layout space) is preferably in a range of about 0.1 to 5 μm.

In the via group shown in FIG. 4A, only the power-supply through vias 31 and the ground through vias 32 are placed. However, in the case where through vias to each of which a signal is inputted are present in the via group, the power-supply through vias 31 and the ground through vias 32 are preferably alternately arranged so as to surround each of signal through vias 30, as shown in FIG. 4B. In the arrangement, the power-supply through vias 31 and the ground through vias 32 function as a shield for the signal through vias 30 which prevents mutual interference between the signal through vias 30. As a result, it is possible to implement the semiconductor device with reduced crosstalk.

Figure 5:
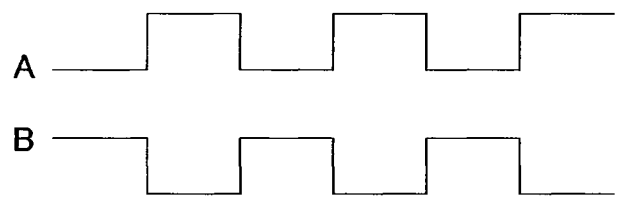
FIG. 5 is a view showing an example of mutually complementary potentials of through vias adjacent to each other in a via group provided in the semiconductor device according to the third example embodiment.

In each of the via groups shown in FIGS. 4A and 4B, the power-supply through vias 31 and the ground through vias 32 are placed as an example of the through vias having potentials complementary to each other. However, the concept of the present disclosure is not limited thereto. Instead of the ground through vias 32, through vias to which another voltage complementary to the power supply voltage is applied may also be placed. Instead of the power-supply through vias 31 and the ground through vias 32, through vias having respective potentials A and B which vary with time as shown in, e.g., FIG. 5 may also be placed.

Fourth Example Embodiment

Figure 6A:
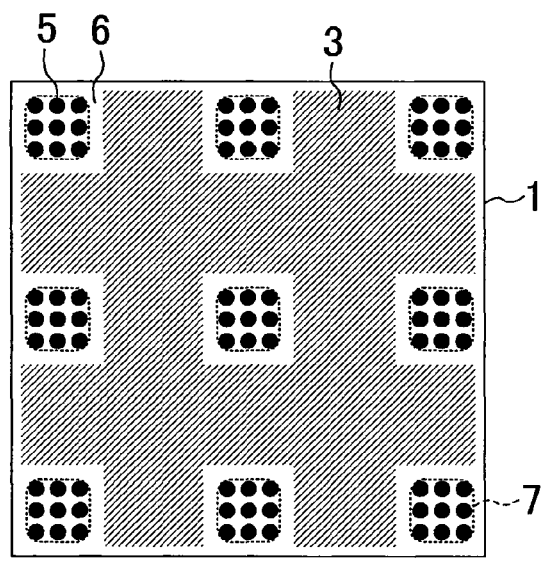
FIGS. 6A and 6B are plan views of a semiconductor device according to a fourth example embodiment of the present disclosure.

FIG. 6A is a plan view of a semiconductor device according to the fourth example embodiment. Note that the fourth example embodiment is obtained by modifying the first example embodiment shown in FIGS. 1A and 1B, and is basically the same as the first example embodiment except for the items described below. The components in FIG. 6A that are the same as the components of the first example embodiment shown in FIGS. 1A and 1B are provided with the same reference numerals.

Figure 11:
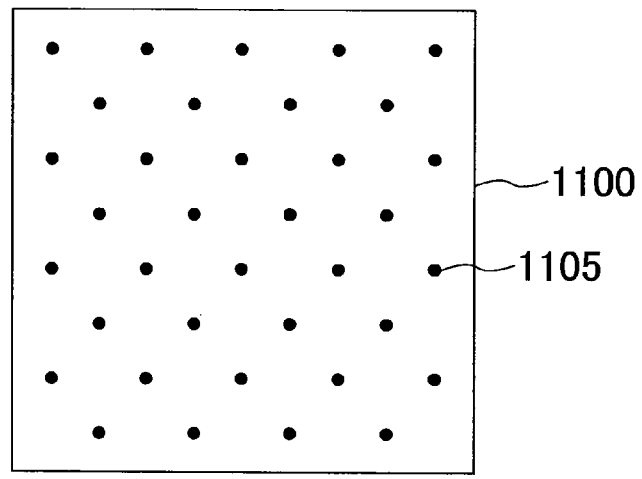
FIG. 11 shows a layout of through vias in a conventional stacked semiconductor device described in Japanese Laid-Open Patent Publication No. 2004-335948.
Figure 12:
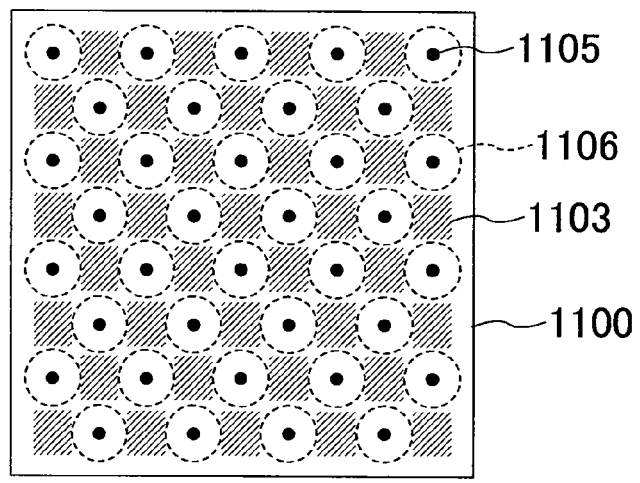
FIG. 12 is a view illustrating a problem which occurs when "buffer regions" according to the present disclosure are set to the conventional layout of the through vias shown in FIG. 11.

After a semiconductor device having through vias is bonded to a base substrate, or after the semiconductor device and another semiconductor device are stacked and electrical connections therebetween are provided using the through vias, the gap between the semiconductor device and the base substrate or the other semiconductor device is filled with a filler such as, e.g., an underfill. At this time, when the through vias are arranged in an area array configuration as arranged using a prior-art technique as shown in, e.g., FIG. 11, the area of an injection opening in a side surface of the semiconductor device through which the underfill is injected is reduced, and the flow-in path of the underfill is also thinned. As a result, the filling of the gap with the underfill becomes difficult, and consequently a large unfilled region not filled with the underfill may be formed between the semiconductor device having the through vias and the base substrate or the other semiconductor device. Thus, depending on the arrangement of the through vias, a problem occurs in the filling of the gap with the underfill.

By contrast, in the present example embodiment, the nine via groups 7 each formed by densely forming the plurality of through vias 5 are disposed in the semiconductor device, and further equidistantly arranged, as shown in FIG. 6A. By thus equidistantly arranging the plurality of via groups 7, the gap between the via groups 7 which serves as the injection opening of the underfill in the side surface of the semiconductor device is increased, and the cross-sectional area of the flow-in path of the underfill is equally enlarged over the entire semiconductor device. As a result, it is possible to easily perform the injection of the underfill.

Note that, in the present example embodiment, the filling of the gap with the underfill in the regions where the via groups 7 are placed becomes difficult, but the formation of the large unfilled region can be prevented, and the ratio of filling with the underfill is improved from the standpoint of the entire semiconductor device. Therefore, it is possible to implement the semiconductor device with improved bonding reliability.

Figure 6B:
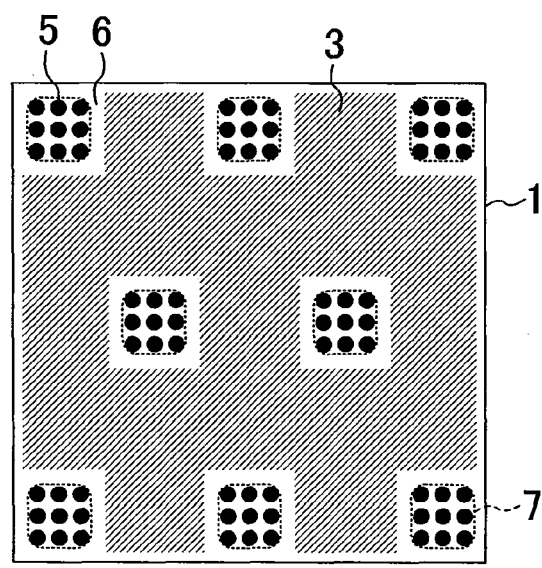

The present example embodiment has shown the case (FIG. 6A) where the three via groups 7 are arranged in each of the vertical and lateral directions. However, the manner in which the via groups 7 are arranged in the present disclosure is not particularly limited as long as the total number of the via groups 7 is three or more. For example, it is also possible that the ten via groups 7 may be arranged in each of the vertical and lateral directions. Alternatively, instead of arranging the via groups 7 in rows and columns, the via groups 7 may also be arranged in a staggered configuration as shown in FIG. 6B. Note that, if the via groups 7 are equidistantly arranged, the effect of allowing easy filling of the gap with the underfill can be obtained.

Fifth Example Embodiment

Figure 7A:
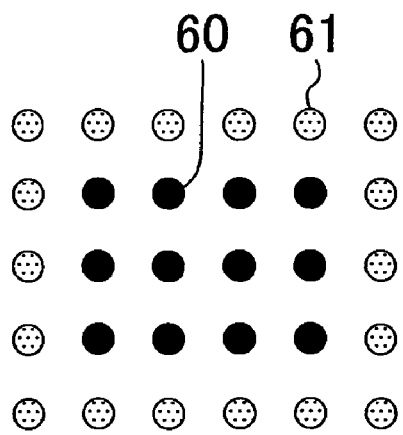
FIG. 7A is a view showing a plan configuration of a via group in a semiconductor device according to a fifth example embodiment of the present disclosure.

FIG. 7A is a view showing a plan configuration of the via group in a semiconductor device according to the fifth example embodiment. Note that the fifth example embodiment is obtained by modifying the first example embodiment shown in FIGS. 1A and 1B, and is basically the same as the first example embodiment except for the items described below.

The through vias are formed through processes such as the step of transferring a through hole pattern by photolithography, and the step of forming through holes by etching. However, in the case where the through vias are to be densely arranged, a problem may occur in the shape of a through hole depending on process conditions. For example, in the case of forming the densely arranged through holes by dry etching using a plasma, the balance between the etching and the formation of a sidewall protective film may be lost at a peripheral portion of the pattern of the densely arranged through holes depending on etching conditions to result in the occurrence of a failure in the shape of the through hole.

To prevent this, in the via group shown in FIG. 7A according to the present example embodiment, a plurality of through vias (true through vias) 60 used for electrical connections are disposed at the center portion of the via group, while dummy through vias 61 not electrically connected to the wires in the semiconductor device are disposed at a peripheral portion of the via group. In other words, the dummy through vias 61 are arranged around the plurality of true through vias 60. The configuration allows a shape failure resulting from a process or the like to principally occur in any of the dummy through vias disposed at the peripheral portion of the via group. As a result, it is possible to form each of the true through vias 60 used for electrical connections into a normal shape. Therefore, it is possible to improve the reliability of the true through vias 60.

As the material of the dummy through vias 61, there may be used Cu, Al, W, polysilicon, or the like similarly for the true through vias 60. Alternatively, an insulator such as $SiO_2$ may also be used. By using the metal material shown above or another material having excellent thermal conductivity as the material of the dummy through vias 61, it is also possible to improve the heat dissipation property of the semiconductor device.

Since the main purpose of using the dummy through vias is not to provide electrical connections, if the dummy through vias using a conductive material are used alone for electrical connections, the performance thereof may not be sufficient due to the high resistance value thereof or the like. However, for the purpose of, e.g., reducing the resistance of the power supply line in the single via group, the dummy through vias may also be auxiliarily disposed for the true through vias forming the power supply line (hereinafter referred to as the true power-supply through vias) so as to form the power supply line (dummy through vias used for such a purpose will be hereinafter referred to as "auxiliary through vias". By thus applying the same power supply voltage as applied to the true power-supply through vias present in the same via group to the auxiliary through vias, it is possible to reduce the resistance of the power supply line. Therefore, it is possible to prevent a reduction in the power supply voltage supplied to the semiconductor device. In the case of causing a shape failure resulting from a process or the like at the peripheral portion of the via group through the adjustment of process conditions, it is preferable to dispose the auxiliary through vias at the peripheral portion of the via group, i.e., not to dispose the true through vias at the peripheral portion of the via group. This can prevent a reduction in the reliability of the true through vias even when a problem such as a shape failure occurs.

Figure 7B:
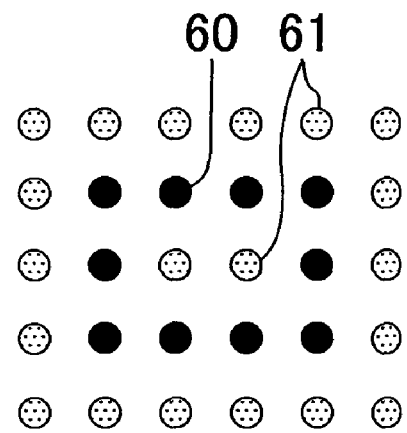
FIG. 7B is a view showing a plan configuration of a via group in a semiconductor device according to a variation of the fifth example embodiment.

In the via group shown in FIG. 7A, the dummy through vias 61 are disposed at the peripheral portion thereof. However, in the case of causing a failure resulting from a process or the like at the center portion of the via group, the dummy through vias 61 may also be disposed at the center portion of the via group, as shown in FIG. 7B. This allows the true through vias 60 used for electrical connections to be coarsely arranged so that the routing of the wires is performed easily in the semiconductor device.

To mount the semiconductor device having the through vias on a base substrate or stack the semiconductor device and another semiconductor device while ensuring a balanced state of a stress, the numbers of the through vias forming the individual via groups in the semiconductor device are preferably substantially the same. Accordingly, in the case where the numbers of the true through vias forming the individual via groups each disposed in the same semiconductor device differ from one via group to another, the dummy through vias are placed in the via groups in which the numbers of the true through vias are relatively small to allow an adjustment such that the numbers of the through vias forming the individual via groups are substantially the same.

Sixth Example Embodiment

Figure 8A:
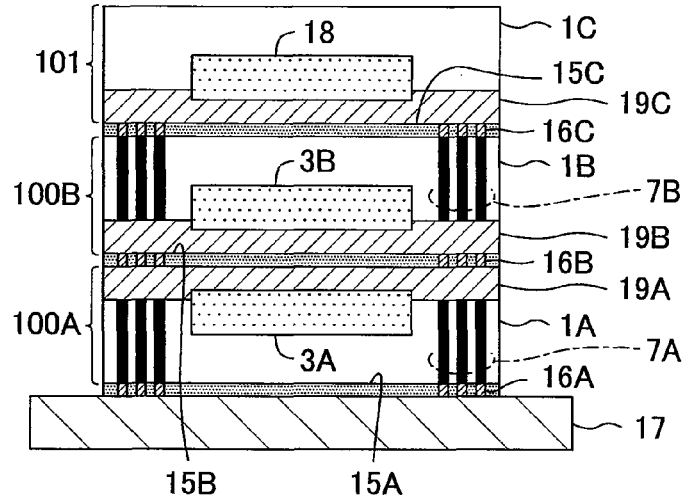
FIG. 8A is a cross-sectional view of a stacked semiconductor device according to a sixth example embodiment of the present disclosure.

FIG. 8A is a cross-sectional view of a stacked semiconductor device according to the sixth example embodiment. The present example embodiment relates to a stacked semiconductor device in which a plurality of semiconductor devices including at least one semiconductor device according to the first example embodiment shown in FIGS. 1A and 1B are stacked, and a duplicate description of the description given in the first example embodiment is omitted. For the sake of simplicity, some of the components of the semiconductor device according to the first example embodiment shown in FIGS. 1A and 1B are omitted in FIG. 8A.

In the stacked semiconductor device 200 shown in FIG. 8A, two semiconductor devices 100A and 100B each having through vias and shown as an example in the first example embodiment, and a semiconductor device 101 not having a through via are stacked on a base substrate 17.

The semiconductor device 100A has an active element region (including an isolation) 3A provided in a semiconductor substrate 1A, via groups 7A each including a plurality of through vias extending through the semiconductor substrate 1A, and a wiring layer (including wires electrically connected to the via groups 7A and insulating layers) 19A formed on the active element formation surface of the semiconductor substrate 1A. The semiconductor device 100A is mounted on the base substrate 17 such that the surface of the semiconductor substrate 1A opposite to the active element formation surface thereof faces the base substrate 17. Note that the gap between the base substrate 17 and the semiconductor device 100A is sealed with an underfill 15A, and the electrical connections between the base substrate 17 and the via groups 7A of the semiconductor device 100A are ensured by solder bumps 16A.

The semiconductor device 100B has an active element region (including an isolation) 3B provided in a semiconductor substrate 1B, via groups 7B each including a plurality of through vias extending through the semiconductor substrate 1B, and a wiring layer (including wires electrically connected to the via groups 7B and insulating layers) 19B formed on the active element formation surface of the semiconductor substrate 1B. The semiconductor device 100B is mounted on the semiconductor device 100A such that the wiring layer 19B faces the semiconductor device 100A. Note that the gap between the semiconductor device 100A and the semiconductor device 100B is sealed with an underfill 15B, and the electrical connection between the wiring layer 19A of the semiconductor device 100A and the wiring layer 19B of the semiconductor device 100B is ensured by solder bumps 16B.

The semiconductor device 101 has an active element region (including an isolation) 18 provided in a semiconductor substrate 1C, and a wiring layer (including wires and insulating layers) 19C formed on the active element formation surface of the semiconductor substrate 1C. The semiconductor device 101 is stacked such that the wiring layer 19C faces the semiconductor device 100B. Note that the gap between the semiconductor device 100B and the semiconductor device 101 is sealed with an underfill 15C, and the electrical connections between the via groups 7B of the semiconductor device 100B and the wiring layer 19C of the semiconductor device 101 are ensured by solder bumps 16C.

In the stacked semiconductor device according to the present example embodiment described above, the through vias are used for the electrical connections between the semiconductor devices. Therefore, compared with a conventional stacked semiconductor device using wire bonding, the stacked semiconductor device shorter in wiring length and smaller in size can be implemented. Also, the stacked semiconductor device according to the present example embodiment has the semiconductor device according to the first example embodiment that can be further miniaturized, i.e., the semiconductor devices 100A and 100B each having the via groups according to the present disclosure. Accordingly, compared with a stacked semiconductor device including only the conventional semiconductor device having the through vias, the entire device can be scaled down.

It will be appreciated that a stacking configuration is not limited to the implementation shown in FIG. 8A. All the stacked semiconductor devices each including at least one semiconductor device 100 (including the variations of the second to fifth example embodiments) according to the first example embodiment are included in the concept of the present disclosure.

Figure 8B:
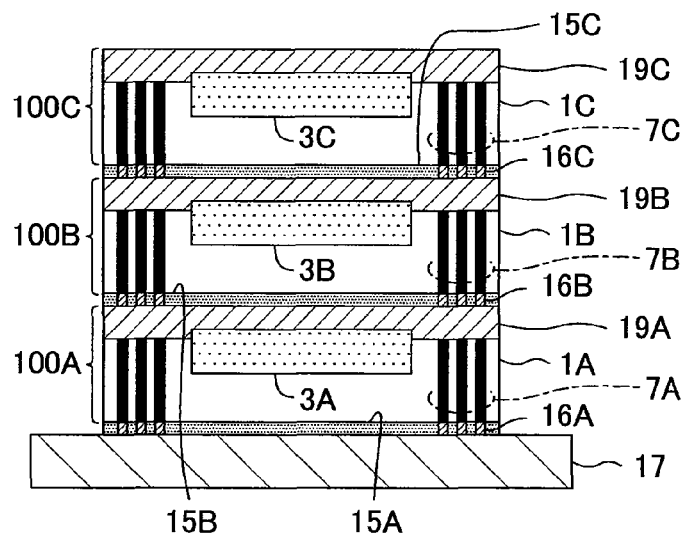
FIGS. 8B and 8C are cross-sectional views of stacked semiconductor devices according to variations of the sixth example embodiment.
Figure 8C:
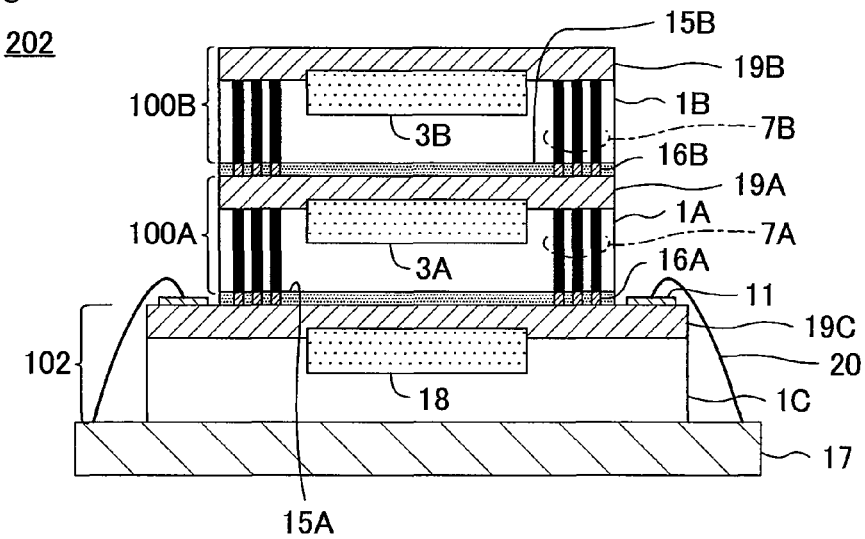

FIGS. 8B and 8C are cross-sectional views of a semiconductor device according to a variation of the present example embodiment. The components shown in FIGS. 8B and 8C that are the same as those of the stacked semiconductor device according to the present example embodiment shown in FIG. 8A are provided with the same reference numerals, and a repeated description thereof is omitted.

In the stacked semiconductor device 201 shown in FIG. 8B, the three semiconductor devices 100A, 100B, and 100C each having the through vias and shown as an example in the first embodiment are stacked on the base substrate 17. That is, all the semiconductor devices included in the stacked semiconductor device 201 have the through vias. The stacked semiconductor device 201 shown in FIG. 8B is different from the stacked semiconductor device 200 shown in FIG. 8A in the following points. First, the semiconductor device 100B is stacked on the semiconductor device 100A such that the surface of the semiconductor substrate 1B opposite to the active element formation surface thereof faces the semiconductor device 100A. In addition, the electrical connections between the wiring layer 19A of the semiconductor device 100A and the via groups 7B of the semiconductor device 100B are ensured by the solder bumps 16B. Further, a semiconductor device 100C has an active element region (including an isolation) 3C provided in the semiconductor substrate 1C, via groups 7C each including a plurality of through vias extending through the semiconductor substrate 1C, and a wiring layer (including wires electrically connected to the via groups 7C and insulating layers) 19C formed on the active element formation surface of the semiconductor substrate 1C. Here, the semiconductor device 100C is stacked on the semiconductor device 100B such that the surface of the semiconductor substrate 1C opposite to the active element formation surface thereof faces the semiconductor device 100B. Note that the gap between the semiconductor device 100B and the semiconductor device 100C is sealed with the underfill 15C, and the electrical connections between the wiring layer 19B of the semiconductor device 100B and the via groups 7C of the semiconductor device 100C are ensured by the solder bumps 16C.

In the stacked semiconductor device 202 shown in FIG. 8C, a semiconductor device 102 not having a through via, and the two semiconductor devices 100A and 100B each having the through vias and shown as an example in the first example embodiment are stacked on the base substrate 17. The stacked semiconductor device 202 shown in FIG. 8C is different from the stacked semiconductor device 200 shown in FIG. 8A in the following points. First, the semiconductor device 102 includes the active element region (including an isolation) 18 provided in the semiconductor substrate 1C, the wiring layer (including the wires and the insulating layers) 19C formed on the active element formation surface of the semiconductor substrate 1C, and the electrode pads 11 formed on the wiring layer 19C. In addition, the semiconductor device 102 is mounted on the base substrate 17 such that the surface of the semiconductor substrate 1C opposite to the active element formation region thereof comes in contact with the base substrate 17. Note that the electrical connections between the electrode pads 11 of the semiconductor device 102 and the base substrate 17 are ensured by wire bonding 20. Next, the semiconductor device 100A is stacked on the semiconductor device 102 such that the surface of the semiconductor substrate 1A opposite to the active element formation region thereof faces the semiconductor device 102. Note that the gap between the semiconductor device 102 and the semiconductor device 100A is sealed with the underfill 15A, and the electrical connections between the wiring layer 19C of the semiconductor device 102 and the via groups 7A of the semiconductor device 100A are ensured by the solder bumps 16A. Next, the semiconductor device 100B is stacked on the semiconductor device 100A such that the surface of the semiconductor substrate 1B opposite to the active element formation surface thereof faces the semiconductor device 100A. Note that the electrical connections between the wiring layer 19A of the semiconductor device 100A and the via groups 7B of the semiconductor device 100B are ensured by the solder bumps 16B.

In the present example embodiment, the electrical connection between the individual semiconductor devices and the electrical connection between the semiconductor device and the base substrate are ensured by the solder bumps, and the gap between the semiconductor devices and the gap between the semiconductor device and the base substrate are filled with the underfills. However, the concept of the present disclosure is not limited thereto. For example, the respective through vias of the stacked semiconductor devices may also be directly bonded to each other using thermocompression, intermetallic bonding, or the like. Alternatively, the respective through vias of the stacked semiconductor devices may also be electrically connected to each other using capacitive coupling, electromagnetic inductive coupling, or the like (with an insulator or a filler interposed between the through vias) instead of being directly bonded to each other.

Seventh Example Embodiment

Figure 9A:
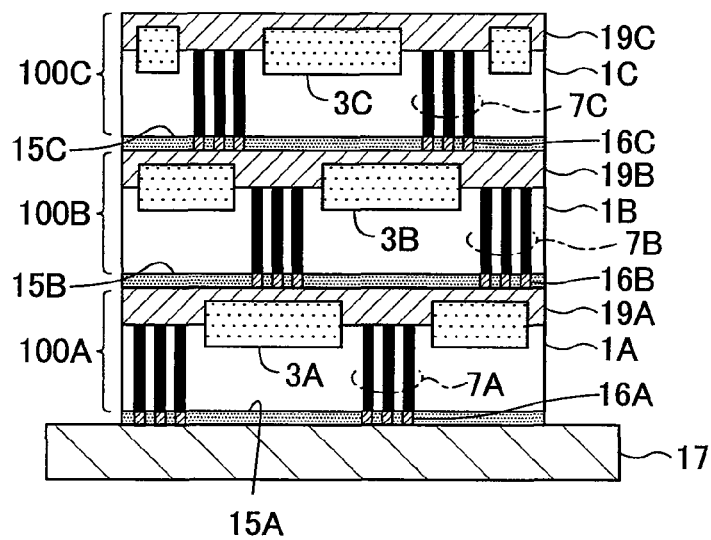
FIGS. 9A and 9B are a cross-sectional view and a plan view of a stacked semiconductor device according to a seventh example embodiment of the present disclosure.
Figure 9B:
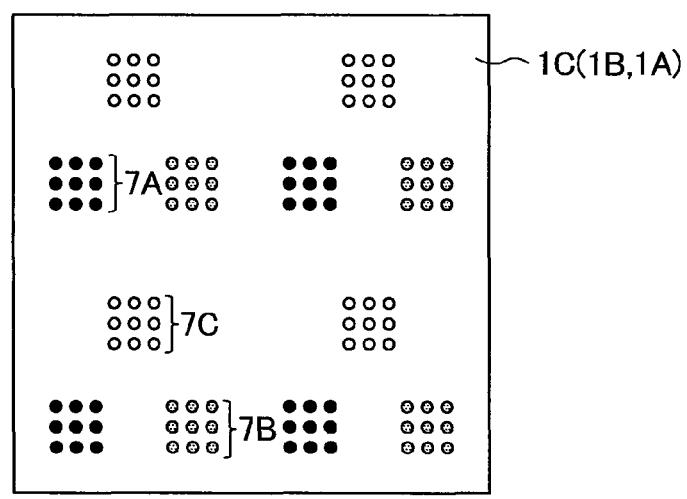
Figure 10:
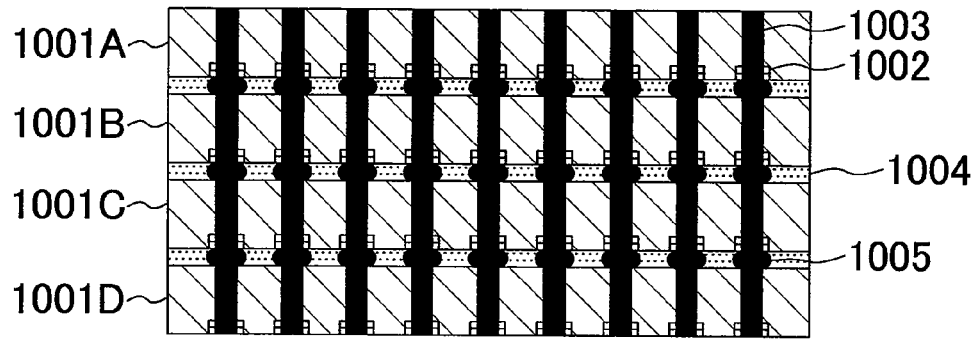
FIG. 10 is a cross-sectional view of a conventional stacked semiconductor device described in Japanese Laid-Open Patent Publication No. 10-163411.

FIGS. 9A and 9B are a cross-sectional view and a plan view of a stacked semiconductor device according to the seventh example embodiment. Note that the plan view shown in FIG. 9B is a view obtained by extracting only the layout of the through vias (via groups) when a stacked semiconductor device 300 according to the present example embodiment is viewed from above the upper surface thereof. The present example embodiment relates to the stacked semiconductor device in which a plurality of semiconductor devices including at least two semiconductor devices according to the first example embodiment shown in FIGS. 1A and 1B are stacked, and a duplicate description of the description given in the first example embodiment is omitted. The stacked semiconductor device 300 shown in FIGS. 9A and 9B are obtained by further modifying the stacked semiconductor device 201 according to the variation of the sixth example embodiment shown in FIG. 8B. The components shown in FIGS. 9A and 9B that are the same as those of the stacked semiconductor device 201 according to the variation of the sixth example embodiment shown in FIG. 8B are provided with the same reference numerals, and a repeated description thereof is omitted.

In a stacked semiconductor device in which an electrical connection between semiconductor devices is provided using through vias, a stress applied from the outside is localized to the through vias due to the structure of the stacked semiconductor device, and consequently each of the semiconductor devices may be damaged. To prevent this, in the stacked semiconductor device, measures for preventing the localization of the external stress is needed.

To satisfy the need, when three semiconductor devices 100A, 100B and 100C each having the through vias are stacked in the stacked semiconductor device 300 shown in FIGS. 9A and 9B according to the present example embodiment, the via groups 7A, 7B, and 7C provided in the respective semiconductor devices 100A, 100B, and 100C are disposed at two-dimensionally different positions. In other words, the via groups 7A, 7B, and 7C in the respective semiconductor devices 100A, 100B, and 100C are disposed so as not to overlap each other.

With the configuration, it is possible to prevent a stress from being localized to a specific portion in the stacked semiconductor device 300, and thereby reduce the possibility of damaging the stacked semiconductor device 300.

While the present disclosure has been described based on the preferred embodiments thereof, the present disclosure is not limited only to the embodiments described above. It will be appreciated that a combination of the individual embodiments is also included in the scope of the present disclosure.

What is claimed is:

1. A semiconductor device, comprising:
a plurality of through vias extending through a substrate, wherein
the plurality of through vias are arranged dividedly in three or more via groups, and
each of the via groups includes three or more of the through vias that are arranged in two dimensions, and
the smallest distance between the individual through vias in each of the via groups is smaller than the smallest one of distances between an active element formed on the substrate and the plurality of through vias.

2. The semiconductor device of claim 1, wherein
a wiring layer is formed on at least one of the first surface and the second surface opposite to the first surface of the substrate, and
at least one of the plurality of through vias and the wiring layer are electrically connected to each other.

3. The semiconductor device of claim 1, wherein an active element is not formed in any of respective regions of the substrate where the individual via groups are disposed.

4. The semiconductor device of claim 1, wherein the smallest distance between the individual via groups is larger than the largest distance between the individual through vias in the one of the via groups that has the smallest layout area.

5. The semiconductor device of claim 1, wherein at least one of the via groups includes two or more of the through vias that have different potentials.

6. The semiconductor device of claim 1, wherein at least one of the via groups includes two or more of the through vias that have the same potentials.

7. The semiconductor device of claim 6, wherein the same signal is inputted to each of the two or more through vias having the same potentials.

8. The semiconductor device of claim 6, wherein the two or more through vias having the same potentials form the same power supply line.

9. The semiconductor device of claim 6, wherein one of the two or more through vias having the same potentials is disposed at a peripheral portion of the via group.

10. The semiconductor device of claim 1, wherein at least one of the via groups includes a first through via having a first potential, and a second through via having a second potential complementary to the first potential, and adjacent to the first through via.

11. The semiconductor device of claim 10, wherein the first through via forms a power supply line, and the second through via forms a ground line.

12. The semiconductor device of claim 10, wherein
the via group further includes a third through via to which a signal is inputted, and
the first through vias and the second through vias are alternately arranged so as to surround the third through via.

13. The semiconductor device of claim 1, wherein the via groups are equidistantly arranged.

14. The semiconductor device of claim 1, wherein at least one of the via groups includes a dummy through via not used for an electrical connection.

15. The semiconductor device of claim 14, wherein the dummy through via is disposed at a peripheral portion of the via group.

16. The semiconductor device of claim 1, wherein at least one of the via groups includes an auxiliary through via which assists an electrical connection of another through via.

17. The semiconductor device of claim 16, wherein the auxiliary through via is disposed at a peripheral portion of the via group.

18. A stacked semiconductor device is a stacked semiconductor device in which a plurality of semiconductor devices are stacked, wherein
at least one of the plurality of semiconductor devices is the semiconductor device of claim 1.

19. A stacked semiconductor device is a stacked semiconductor device in which a plurality of semiconductor devices are stacked, wherein
each of two or more of the plurality of semiconductor devices is the semiconductor device of claim 1, and the individual via groups in each of the two or more semiconductor devices are arranged so as not to overlap each other.

20. A stacked semiconductor device is a stacked semiconductor device in which a plurality of semiconductor devices are stacked, wherein
each of two or more of the plurality of semiconductor devices is a semiconductor device having a plurality of through vias extending through a substrate,
the plurality of through vias are arranged dividedly in three or more via groups, and
each of the via groups includes three or more of the through vias that are arranged in two dimensions, and
the individual via groups in each of the two or more semiconductor devices are arranged so as not to overlap each other.

* * * * *